(12) United States Patent
Cardenas et al.

(10) Patent No.: US 11,243,419 B2
(45) Date of Patent: Feb. 8, 2022

(54) ELECTRO-OPTIC SILICON NITRIDE VIA ELECTRIC POLING

(71) Applicant: University of Rochester, Rochester, NY (US)

(72) Inventors: Jaime Cardenas, Rochester, NY (US); Yi Zhang, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 16/655,816

(22) Filed: Oct. 17, 2019

(65) Prior Publication Data
US 2020/0124884 A1 Apr. 23, 2020

Related U.S. Application Data

(60) Provisional application No. 62/747,250, filed on Oct. 18, 2018.

(51) Int. Cl.
*G02F 1/035* (2006.01)
*H01L 21/02* (2006.01)
*C23C 16/34* (2006.01)
*C23C 16/50* (2006.01)

(52) U.S. Cl.
CPC ............ *G02F 1/035* (2013.01); *C23C 16/345* (2013.01); *C23C 16/50* (2013.01); *H01L 21/0217* (2013.01); *H01L 21/02274* (2013.01); *G02F 2202/20* (2013.01)

(58) Field of Classification Search
CPC . G02F 1/035; G02F 2202/20; H01L 21/0217; H01L 21/02274; C23C 16/345; C23C 16/50; C23C 16/44; C23C 16/507
See application file for complete search history.

(56) References Cited

U.S. PATENT DOCUMENTS

| 5,093,874 | A | * | 3/1992 | Hawkins | ............ | G02B 6/12004 385/14 |
| 7,471,853 | B2 | * | 12/2008 | Sugiyama | ............. | G02F 1/0356 359/245 |
| 8,897,614 | B2 | * | 11/2014 | Suzuki | ................... | G02F 1/035 385/131 |
| 9,664,931 | B1 | * | 5/2017 | Yap | ........................ | G02F 1/225 |

OTHER PUBLICATIONS

Winning the Airwaves: Regaining America's Dominance in The Electromagnetic Spectrum. *CSBA* Available at: <http://csbaonline.org/research/publications/winning-the-airwaves-sustaining-americas-advantage-in-the-electronic-spectr>.
Soref, R. A. & Bennett, B. R. Electrooptical effects in silicon. *IEEE J. Quantum Electron.* 23, 123-129 (1987).
Spector, S. J. et al. Operation and Optimization of Silicon-Diode-Based Optical Modulators. *IEEE J. Sel. Top. Quantum Electron.* 16, 165-172 (2010).

(Continued)

*Primary Examiner* — Jennifer Doan
(74) *Attorney, Agent, or Firm* — Harris Beach PLLC

(57) ABSTRACT

A deposition method for manufacturing an active electro-optic layer includes providing a substrate or a base layer; and applying an electric field across a silicon nitride layer as it is being deposited on the substrate or the base layer to cause a poling of a deposited layer. Alternative methods for poling an active electro-optic layer and an electro-optical device are also described.

6 Claims, 10 Drawing Sheets

(56) References Cited

OTHER PUBLICATIONS

Hu, H., Ricken, R., Sohler, W. & Wehrspohn, R. B. Lithium Niobate Ridge Waveguides Fabricated by Wet Etching. *IEEE Photonics Technol. Lett.* 19, 417-419 (2007).

Cardenas, J. et al. Optical nonlinearities in high-confinement silicon carbide waveguides. *Opt. Lett.* 40, 4138 (2015).

Levy, J. S., Foster, M. A., Gaeta, A. L. & Lipson, M. Harmonic generation in silicon nitride ring resonators. *Opt. Express* 19, 11415-11421 (2011).

Ning, T. et al. Strong second-harmonic generation in silicon nitride films. *Appl. Phys. Lett.* 100, 161902 (2012).

Kitao, A., Imakita, K., Kawamura, I. & Fujii, M. An investigation into second harmonic generation by Si-rich SiN x thin films deposited by RF sputtering over a wide range of Si concentrations. *J. Phys. Appl. Phys.* 47, 215101 (2014).

Pecora, E. F., Capretti, A., Miano, G. & Negro, L. D. Generation of second harmonic radiation from sub-stoichiometric silicon nitride thin films. *Appl. Phys. Lett.* 102, 141114 (2013).

Puckett, M. W. et al. Observation of second-harmonic generation in silicon nitride waveguides through bulk nonlinearities. *Opt. Express* 24, 16923 (2016).

Khurgin, J. B., Stievater, T. H., Pruessner, M. W. & Rabinovich, W. S. On the origin of the second-order nonlinearity in strained Si—SiN structures. *J. Opt. Soc. Am. B* 32, 2494 (2015).

Pavlides, P. & Pugh, D. General theory of Maker fringes in crystals of low symmetry. *J. Phys. Condens. Matter* 3, 967 (1991).

Heisler, I. A., Misoguti, L., Zilio, S. C., Rodriguez, E. V. & Bartolomeu de Araújo, C. Spectrally resolved femtosecond Maker fringes technique. *Appl. Phys. Lett.* 92, 091109 (2008).

Park, D. H. & Herman, W. N. Closed-form Maker fringe formulas for poled polymer thin films in multilayer structures. *Opt. Express* 20, 173-185 (2012).

Garcia, F. C., Carvalho, I. C. S., Hering, E., Margulis, W. & Lesche, B. Inducing a large second-order optical nonlinearity in soft glasses by poling. *Appl. Phys. Lett.* 72, 3252-3254 (1998).

Parsons, G. N., Souk, J. H. & Batey, J. Low hydrogen content stoichiometric silicon nitride films deposited by plasma-enhanced chemical vapor deposition. *J. Appl. Phys.* 70, 1553-1560 (1991).

Seidel, J. et al. Prominent electrochromism through vacancy-order melting in a complex oxide. *Nat. Common.* 3, ncomms1799 (2012).

Xiong, C., Pernice, W. H. P. & Tang, H. X. Low-Loss, Silicon Integrated, Aluminum Nitride Photonic Circuits and Their Use for Electro-Optic Signal Processing. *Nano Lett.* 12, 3562-3568 (2012).

Jung, H., Xiong, C., Fong, K. Y., Zhang, X. & Tang, H. X. Optical frequency comb generation from aluminum nitride microring resonator. *Opt. Lett.* 38, 2810-2813 (2013).

Dong, P. et al. Low Vpp, ultralow-energy, compact, high-speed silicon electro-optic modulator. *Opt. Express* 17, 22484-22490 (2009).

Dong, P. et al. High-speed and compact silicon modulator based on a racetrack resonator with a 1 V drive voltage. *Opt. Lett.* 35, 3246 (2010).

Cox, C. et al. Design of a broadband electro-optic modulator with very low Vπ. *Tech. Pap. Photonic Syst. U. S.* (2003).

Cardenas, J. et al. Low loss etchless silicon photonic waveguides. *Opt. Express* 17, 4752-4757 (2009).

Cardenas, J. et al. High Q SiC microresonators. *Opt. Express* 21, 16882-16887 (2013).

Cardenas, J. et al. High Coupling Efficiency Etched Facet Tapers in Silicon Waveguides. *IEEE Photonics Technol. Lett.* 26, 2380-2382 (2014).

Cardenas, J. et al. Linearized silicon modulator based on a ring assisted Mach Zehnder inteferometer. *Opt. Express* 21, 22549 (2013).

Griffith, A. G. et al. Silicon-chip mid-infrared frequency comb generation. *Nat Commun* 6, (2015).

Phare, C. T., Daniel Lee, Y.-H., Cardenas, J. & Lipson, M. Graphene electro-optic modulator with 30 GHz bandwidth. *Nat. Photonics* 9, 511-514 (2015).

Gabrielli, L. H., Cardenas, J., Poitras, C. B. & Lipson, M. Silicon nanostructure cloak operating at optical frequencies. *Nat. Photonics* 3, 461-463 (2009).

\* cited by examiner

After poling

As deposited

ELECTRO-OPTIC SILICON NITRIDE VIA ELECTRIC POLING

CROSS-REFERENCE TO RELATED APPLICATIONS

This application claims priority to and the benefit of U.S. provisional patent application Ser. No. 62/747,250, ELECTRO-OPTIC SILICON NITRIDE VIA ELECTRIC POLING, filed Oct. 18, 2018, which application is incorporated herein by reference in its entirety.

STATEMENT REGARDING FEDERALLY FUNDED RESEARCH OR DEVELOPMENT

This invention was made with government support under grant number ECCS1941213 awarded by the National Science Foundation. The government has certain rights in the invention.

FIELD OF THE APPLICATION

The application relates to active electro optic materials and particularly to forming active electro optic materials on a substrate or base layer.

BACKGROUND

Photonic devices operate in the UV, Visible, Near IR, and Mid IR parts of the electromagnetic spectrum. Photonic devices are used, for example, in communications over optical fiber links or line of sight free-space connections. Photonic technologies are also fundamental in light detection and ranging (LIDAR) to acquire targets and guide vehicles, e.g. autonomous vehicles. Also, aircraft use light to carry signals across systems to reduce weight and resist electromagnetic interference.

SUMMARY

A deposition method for manufacturing an active electro-optic layer includes providing a substrate or base layer; and applying an electric field across a silicon nitride layer as it is being deposited on the substrate or base layer to cause a poling of a deposited layer.

The step of applying can include applying the electric field across the silicon nitride layer as it is being deposited on the substrate or base layer using a CMOS process. The step of applying can include applying the electric field across the silicon nitride layer as it is being deposited on the substrate or base layer to form an electro-optic silicon nitride (EO-SiN) thin film layer. The step of applying can include applying the electric field across the silicon nitride layer as it is being deposited on the substrate or base layer by a low-pressure chemical vapor deposition (LPCVD) process. The step of applying can include applying the electric field across the silicon nitride layer as it is being deposited on the substrate or base layer by an inductively coupled plasma enhanced chemical vapor deposition (ICPCVD) process. The step of applying can include applying the electric field across the silicon nitride layer as it is being deposited on an electrically biased substrate. The step of applying can include applying the electric field across the silicon nitride layer as it is being deposited on an electrically biased substrate to form an EO-SiN modulator.

The method can further include after the step of applying, applying at least one more step of applying the electric field across another silicon nitride layer as it is being deposited on the substrate or base layer to form at least one more stacked poled layer of a 3D photonics structure. The method can further include after the step of applying, repeating the step of applying N times to form N stacked poled layers of a 3D photonics structure.

Another method for poling an active electro-optic layer includes providing a substrate or base layer and disposed thereon a silicon nitride film layer; heating the silicon nitride film layer; and applying an electric field across the silicon nitride film layer to cause poling of a deposited layer.

The step of applying can include applying the electric field between a nitride film and a back of a silicon wafer substrate.

The method wherein before the step of applying, a step of immersing the substrate or base layer in an electrolyte solution.

Yet another method for poling an active electro-optic layer includes providing a substrate or base layer and disposed thereon a silicon nitride film layer; and applying an electric field across the silicon nitride film layer by use of a probe with a conductive tip to cause poling of a deposited layer.

The step of applying the electric field can include applying the electric field by a bias voltage applied between the conductive tip and the silicon nitride film layer to cause poling of the deposited layer. The step of applying the electric field can include applying the electric field by an atomic force microscope (AFM) probe to selectively pole written portions into the silicon nitride film layer.

An integrated device including electro-optical structure to be poled during device fabrication includes a substrate or a base layer. At least one optical waveguide includes a silicon nitride deposited on the substrate or the base layer. A first electrode is deposited on the substrate or the base layer on a first side of or above the at least one optical waveguide. The first electrode can accept a first polarity of a high voltage bias. A second electrode is deposited on a second side of or below the at least one optical waveguide. The second electrode can accept a second polarity of the high voltage bias. The at least one optical waveguide is poled by application of the high voltage bias during production.

At least one of the first electrode and the second electrode can include an ohmic heating element adapted to accept a heating current applied therethrough.

The electrode and the second electrode can include operating terminals of the integrated device.

The optical waveguide can include a ring resonator. The first electrode is disposed within the ring resonator, and the second electrode is disposed outside of the ring resonator, and the first electrode includes a circular shape, and the second electrode includes an annulus shape.

The integrated device can include an integrated silicon nitride optical waveguide as part of a CMOS integrated circuit.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

DETAILED DESCRIPTION

Figure 1B:
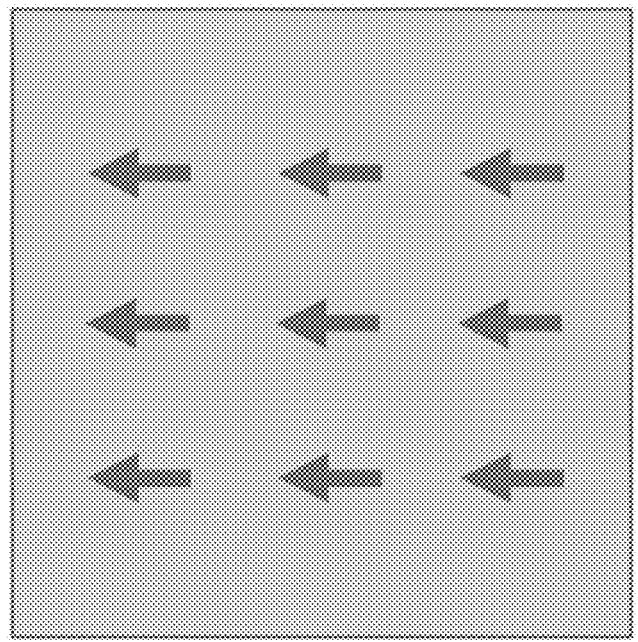
FIG. 1B shows a dipole orientation in a material where the poling process aligned the dipoles along the same direction giving rise to the electro-optic effect.

In the description, other than the bolded paragraph numbers, non-bolded square brackets ("[ ]") refer to the citations listed hereinbelow.

Integrating Complementary Metal-Oxide-Semiconductor (CMOS) electronics with photonic devices in a single platform will enable low-cost technologies to access and control the electromagnetic spectrum from the visible into the IR in low size, weight, and power (SWaP) packages. CMOS electronics are used in microprocessors, memory, digital and analog circuits, and microcontrollers. CMOS dominates the electronics landscape and has a large manufacturing infrastructure, leading to low cost. On the other hand, multiple materials platforms are used in photonics depending on the application. The diverse photonic platforms present a challenge towards integration. For example, modulators, used to encode information into light, are implemented in lithium niobate, while III-V materials such as Indium Phosphide are used for laser diodes. Recently, silicon photonics has become a promising platform for photonics integration with electronics.

However, current approaches to electronic and photonic integration on a single chip are limited by a lack of optically active materials that are compatible with electronics manufacturing. Optically active materials enable tuning of the electromagnetic spectrum by applying a voltage to change their refractive index. The ideal material for integrated photonics is compatible with CMOS electronics, has a high refractive index, can be deposited, is electro-optically active, and has a low loss. Current photonic platforms fall short of meeting these characteristics.

Because of its high refractive index and relative compatibility with CMOS electronics, silicon has revolutionized photonics over the last two decades. However, the silicon photonic platform is fundamentally limited by loss. Because silicon doesn't exhibit a Pockel's effect due its symmetric crystalline structure, to realize active devices one must use the plasma dispersion effect [2]. The plasma dispersion effect produces a change in refractive index when the free carrier density of the material changes. Unfortunately, free carriers lead to optical loss due to absorption and the change in refractive index is fundamentally limited by loss [3]. While heat can be used to change the refractive in silicon, this process is relatively slow (on the order of 1-10 μs). In silicon fast (tens of picoseconds) change in the refractive index cannot be induced, without inducing loss.

The optical loss inherent to the silicon photonics platform leads to increased power consumption. While photonic devices in silicon are relatively small and consume relatively low electrical power, optical loss still leads to increased electrical power consumption. The link between optical loss and electrical power consumption is through the light source: the laser. For example, to compensate typical photonic device loses 50% of the incident optical power, the power of the laser must be doubled, thus doubling the power consumption of the device. Additionally, the lost power eventually ends up as heat, which must be removed from the device, leading to additional power consumption.

Lithium Niobate and III-V compound semiconductors (e.g. InP, GaAs) have a native electro-optic effect and their refractive index can be tuned by applying a voltage without inducing optical loss. However, Lithium Niobate and III-V compound semiconductors are expensive and must be bonded to integrate them with CMOS electronics. The bonding process is expensive and can only yield one active optical layer. Other materials with an electro-optic effect, such as silicon carbide and electro-optic polymers, suffer from lack of suitable substrates and reliability, respectively.

This Application describes a new method for engineering an electro-optic effect in deposited silicon nitride (EO-SiN) by electrical poling. According to the new method of the Application, the EO-SiN can be deposited using standard CMOS manufacturing processes. A photonic platform so made according to the new method can enable large-scale monolithic integration of photonics and CMOS electronics for RF, LIDAR, quantum optics, optical clocks, and signal processing for EMS dominance. The new method will also enable large-scale integration of multilayer photonics with electronics using the CMOS manufacturing infrastructure for low power, low cost, adaptive devices to control the electromagnetic spectrum.

The description continues in 7 parts. Part 1 describes a technical approach of engineering an electro-optic effect by poling. Part 2 describes a laboratory apparatus to measure $\chi^{(2)}$ properties of deposited thinfilms. Part 3 describes electrical poling of silicon nitride films. Part 4 describes an In-situ electrical poling of silicon nitride films during deposition. Part 5 describes an exemplary EO-SiN microring modulator. Part 6 describes exemplary applications. Part 7 describes 3D photonics structures. Part 8 describes poling silicon nitride structures with an electric field across a local area heated by an integrated microheater.

Part 1—Technical Approach of Engineering an Electro-Optic Effect by Poling

An ideal material for integrated photonics is low loss, has a high refractive index, is deposited, has CMOS compatibility, and is electro-optically active; however, current photonic platforms fall short of meeting these characteristics. Crystalline silicon has a high refractive index and is CMOS compatible, however silicon requires expensive silicon on insulator (SOI) wafers (i.e. cannot be deposited), has high optical losses, and has no electro-optic effect. The refractive index of silicon is tuned by moving electrical carriers, which leads to loss [3]. Other active materials for photonics, such as lithium niobate [4] and silicon carbide [5] lose their attractive properties when deposited and otherwise are challenging to integrate with CMOS electronics (Table I). Silicon nitride is a low loss (transparent from the UV to the midIR), deposited, CMOS compatible material with a high refractive index, but it is passive. Recently, several works have observed weak second harmonic generation in as-deposited silicon nitride [6-10]. In a seminal theoretical work, Khurgin, et al. [11] have shown that the origin of the weak electro-optic effect observed in silicon nitride is due to order in the material that is induced by strain in the film. Their hypothesis explains why as-deposited silicon nitride films show an electro-optic effect (2.5 pm/V), while annealed films show a much lower one (0.01 pm/V) [6,7].

The Application describes a device and method to engineer the order in a silicon nitride film using an applied electric field.

Figure 1A:
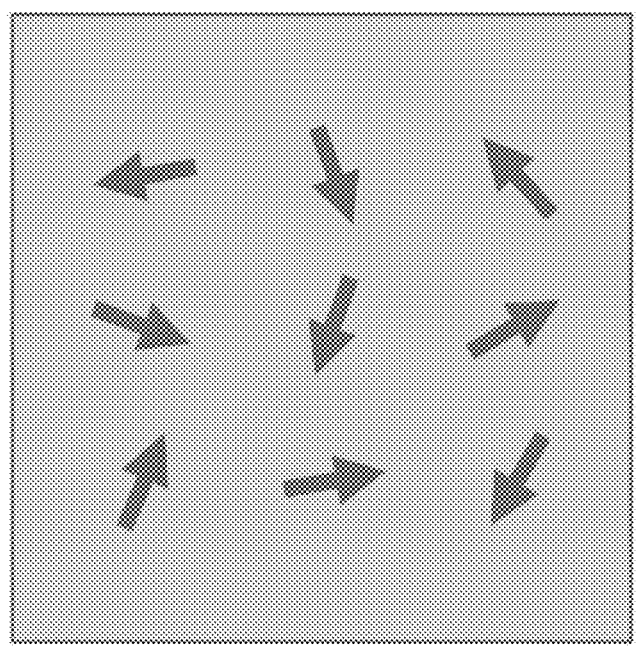
FIG. 1A shows a dipole orientation in a material where deposition dipoles in the material have a random orientation.

FIG. 1A to FIG. 1B shows a dipole orientation in a material before and after poling. FIG. 1A shows a dipole orientation in a material where deposition dipoles in the material have a random orientation. FIG. 1B shows a dipole orientation in a material where the poling process has aligned the dipoles along the same direction giving rise to the electro-optic effect.

A strong electric field can change the material properties to engineer an electro-optic effect in a process called poling. In silicon nitride, which is a polar material, each tetragon in the material behaves like a dipole [11]. During deposition the dipoles are arranged in random directions and the net nonlinear polarizability is negligible (FIG. 1A). Applying a strong electric field will change the direction of the dipoles. If a strong enough electric field is applied, one can align the majority of the dipoles in the material with the direction of the applied electric field (FIG. 1B). Heating the material to be poled increases the mobility of the dipoles and reduces the electric field needed to realign them.

Figure 2:
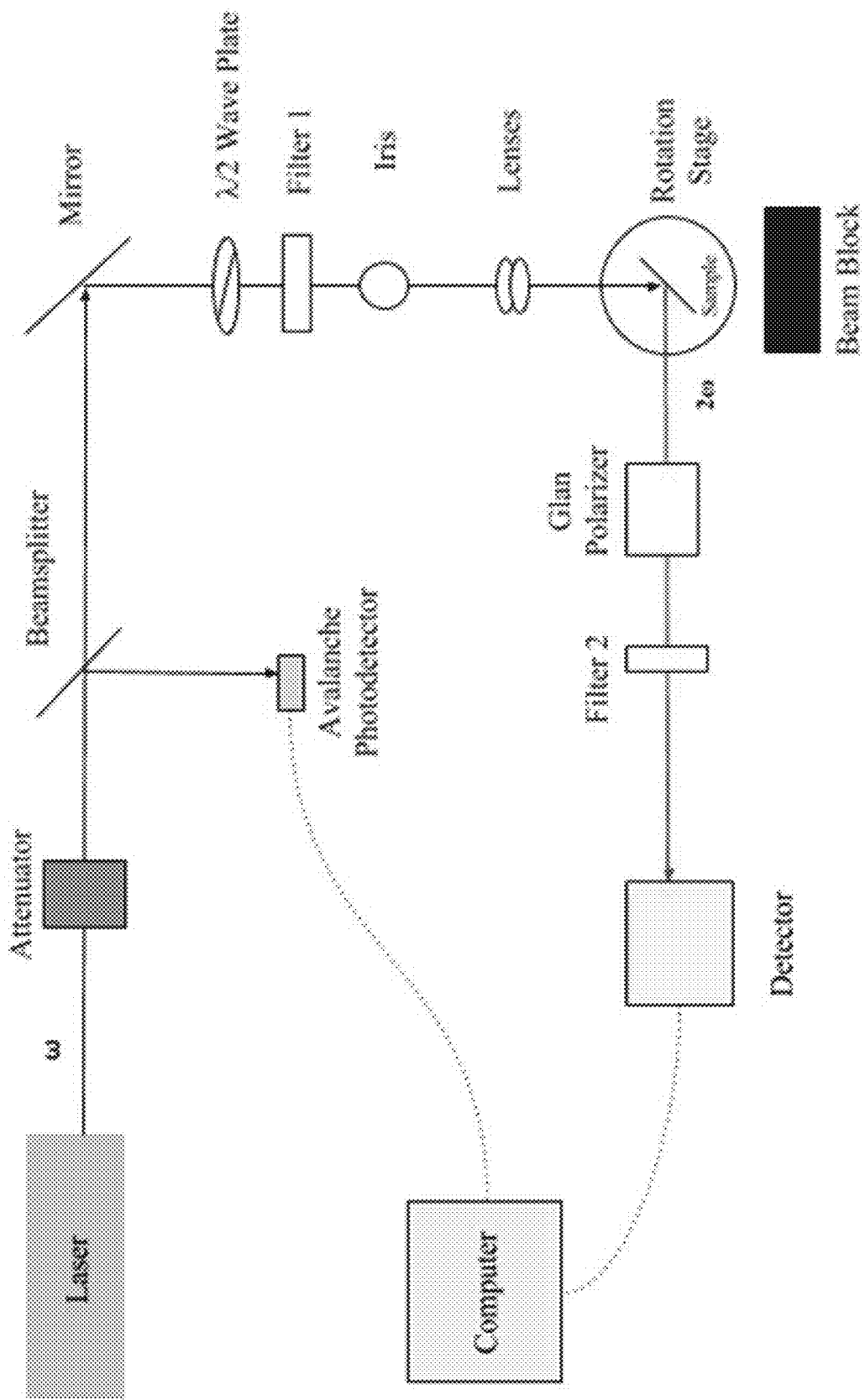
FIG. 2 is a schematic diagram showing an exemplary Maker fringes experimental setup.

Part 2—Laboratory Apparatus to Measure $\chi^{(2)}$ Properties of Deposited Thinfilms FIG. 2 is a schematic diagram showing an exemplary Maker fringes experimental setup based on Verbiest, et al. [12].

As used hereinbelow, $\chi^{(2)}$ is the nonlinear second order optical susceptibility. The $\chi^{(2)}$ properties of deposited thin films are typically measured via second harmonic generation. However, in order to distinguish between second harmonic generation from the bulk of the thin film and surface, a variation of the Maker fringes technique should be used [12-15]. The Maker fringes technique includes rotating the sample and measuring the second harmonic generation of the sample as a function of angle. The Maker fringes technique works by measuring the second harmonic (SH) signal produced by a noncentrosymmetric material possessing a $\chi^{(2)}$ term. Such materials exhibit fundamental optoelectronic properties that are integral for photonic applications. The sample can be placed on a rotation stage. As the sample rotates about its axis, the SH signal should vary in a sinusoidal manner (FIG. 2).

The model and experimental technique can be used for reflective substrates. This technique is normally implemented for samples with a transparent substrate. Films can be deposited on a silicon substrate, which is transparent at 1550 nm, but reflective at the second harmonic wavelength of 775 nm. Because silicon is a centrosymmetric crystal, it lacks the $\chi^{(2)}$ term and will not produce an SH signal. However, an analytical model that describes configuration device and method configurations of the Application (FIG. 2) can be used. A lithium niobate on oxide on a silicon substrate can be used to validate the model (Oxide doesn't exhibit a $\chi^{(2)}$ term so it won't contribute to the SH signal, either.) Because lithium niobate is a well-known material its properties can be measured using our new technique to validate the new model. A 1550 nm femtosecond laser with high peak power (~300 kW) can be directed towards an attenuator, a beam splitter, and a mirror. The attenuator allows for fine control of the pulse power incident on the sample. One of the beams from the beamsplitter can be directed towards an avalanche photodetector as a reference beam. The second beam can then be directed towards a mirror (to condense the setup), and cleaned by the λ/2 wave plate, a filter, and a diaphragm. The lens setup gives us control over the beam's spot size at the sample. The output SH or 2ω beam can be cleaned via the Glan Polarizer and Filter 2. Filter 2 can also be used to prevent the main laser beam from interfering with the measurements. Finally, the SH beam generated by the film deposited on the wafer can be directed to a detector, where the SH signal can be processed to monitor the sample's SH efficiency and the coherence length. The sample, polarizer, filter, and detector rotate together to maintain alignment between the SH signal and the detector. Note that most of the pump light can transmit through the silicon wafer since silicon is transparent at 1550 nm.

Part 3—Electrical Poling of Silicon Nitride Films

Electrical poling is a technique used to align the dipoles of a material along a desired direction. Electrical poling is used to "activate" electro-optic polymers whose dipoles are randomly oriented during spin coating. Electrical poling can also be used to flip the dipole arrangement in lithium niobate to create periodically poled lithium niobate and allow quasi phase matching. Electrical poling has also induced an electro optic effect in glass. For glasses with ionic dopants, the induced electro-optic effect is strong [16]. However, even for pure silica, a measurable electro-optic coefficient can be created by applying a strong electric field [17].

An electro optic effect can be induced in deposited silicon nitride using two electrical poling techniques: 1—applying an electric field while heating, and 2—atomic force microscopy poling.

Figure 3A:
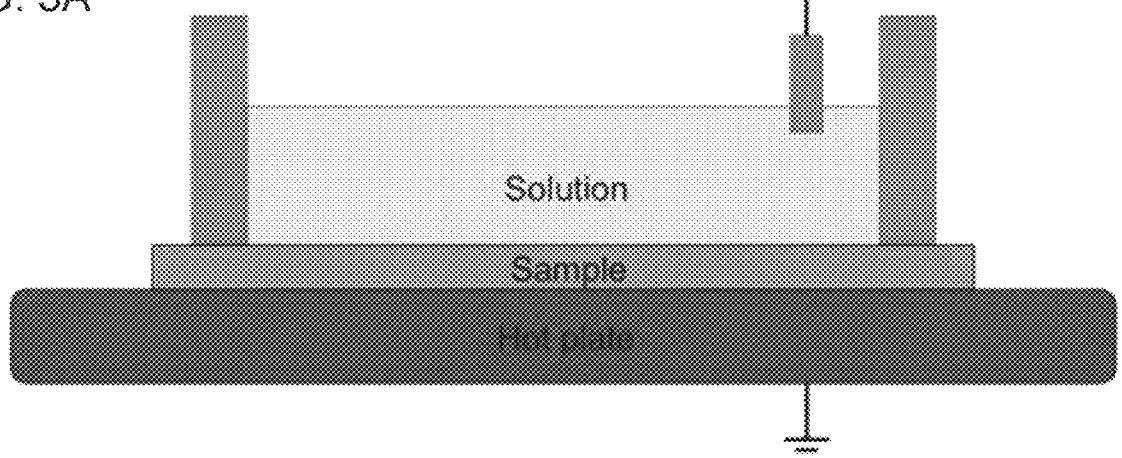
FIG. 3A shows a drawing of an exemplary setup for electrical poling.
Figure 3B:
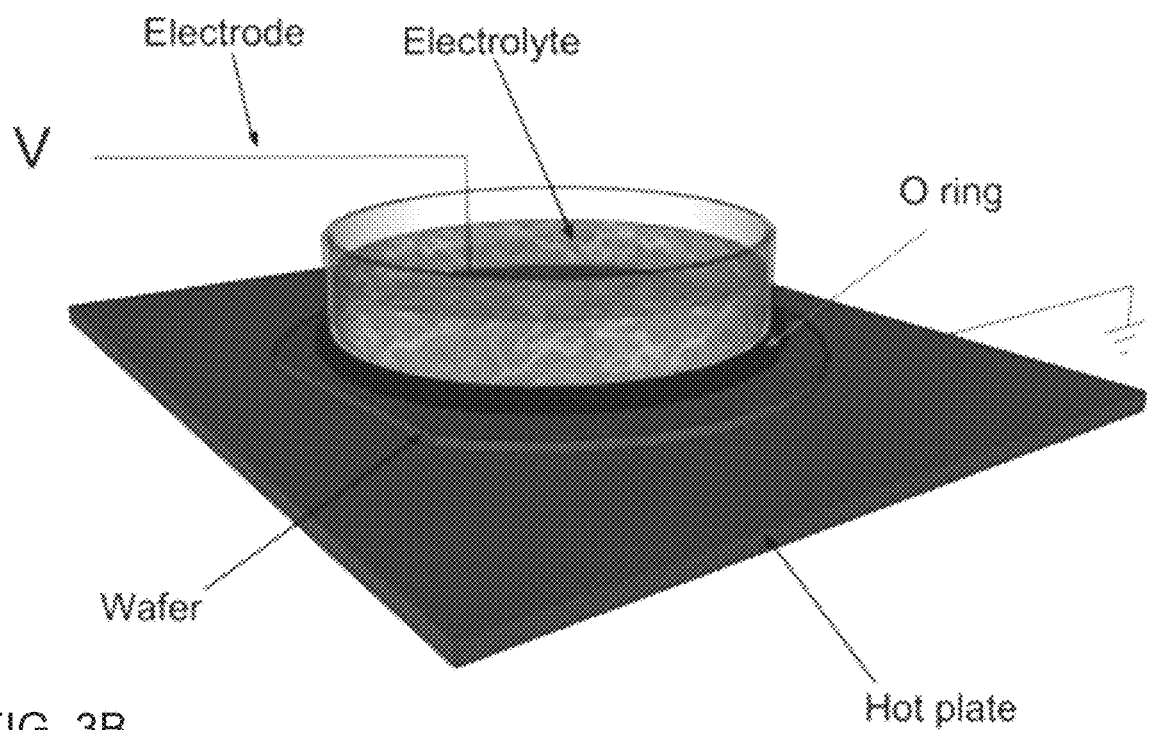
FIG. 3B shows a cross section drawing of the setup of FIG. 3A.

FIG. 3A shows a drawing of an exemplary setup for electrical poling. FIG. 3B shows a cross section drawing of the setup of FIG. 3A. The wafer sits between a grounded hot plate and the electrolyte solution. The voltage from an arbitrary waveform generator is amplified before reaching the electrode.

To pole with an electric field while heating the sample, a silicon wafer coated with a silicon nitride film can be immersed in an electrolyte solution and a voltage can be applied between the nitride film and the back of the silicon wafer (FIG. 3A, FIG. 3B). Because the silicon wafer has a low resistivity, a strong electric field can be induced across the silicon nitride film just below its dielectric breakdown of 10 MeV/cm [18]. To increase the mobility of the dipoles in the film, the sample can be heated. The electric field can stay on until the sample cools down in order to "freeze" the dipoles in their ordered place. The shape and duration of the applied electric field waveform can be optimized to enhance dipole alignment. Because silicon nitride is a very stable material, which is typically used as a diffusion barrier, the electro-optic characteristics can be long-lasting.

Figure 4:
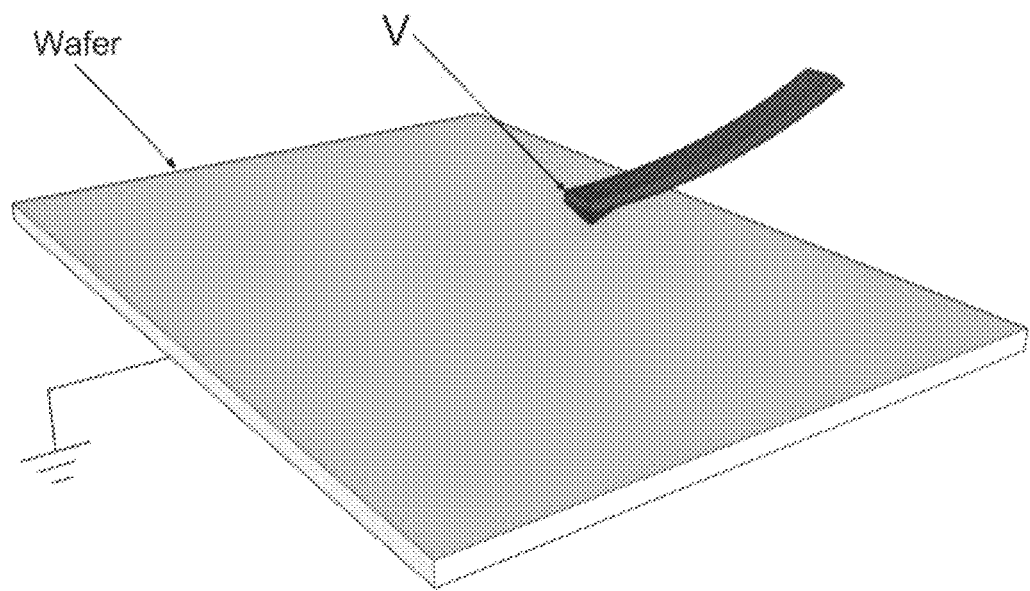
FIG. 4 shows a drawing of an exemplary Atomic Force Microscopy (AFM) poling process.

FIG. 4 shows a drawing of an exemplary Atomic Force Microscopy (AFM) poling process. During the "write" cycle a high voltage is applied to the conductive tip while scanning across the area being poled. For the "read" cycle, the voltage is reduced, and the tip is scanned over the sample again.

Atomic Force Microscopy (AFM) poling can be performed by use of a conductive AFM tip where a bias voltage is applied between the sample and tip. Because the tip is sharp, very high electric fields can be applied over precise areas on the samples. Moreover, once the dipoles are realigned on the sample, the poling on the sample can be "read" by scanning over that same area with a low voltage [19] (FIG. 4). The AFM poling technique allows selective poling over the areas where refractive index modulation is needed.

Figure 5A:
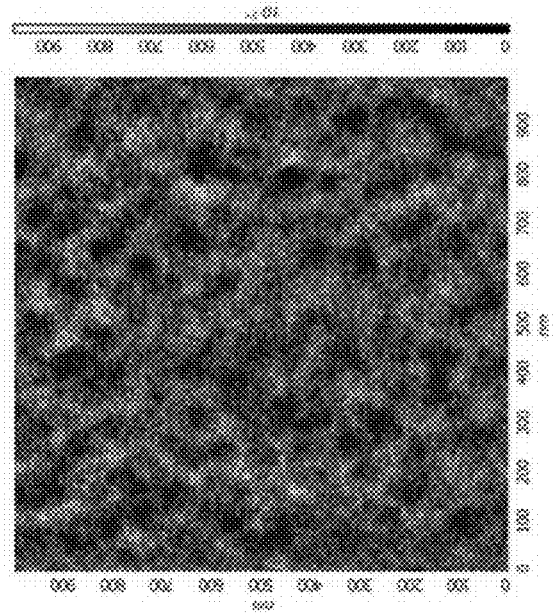
FIG. 5A shows an AFM image of a Topography of an as-deposited nitride film.
Figure 5B:
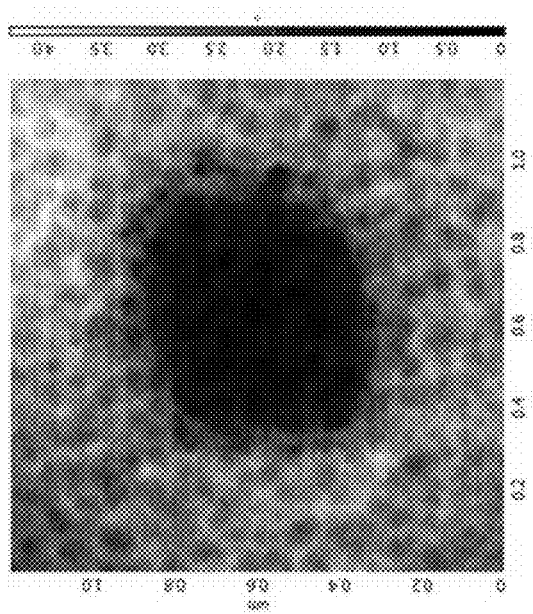
FIG. 5B shows an AFM image of an EFM phase image of as-deposited nitride film.
Figure 5C:
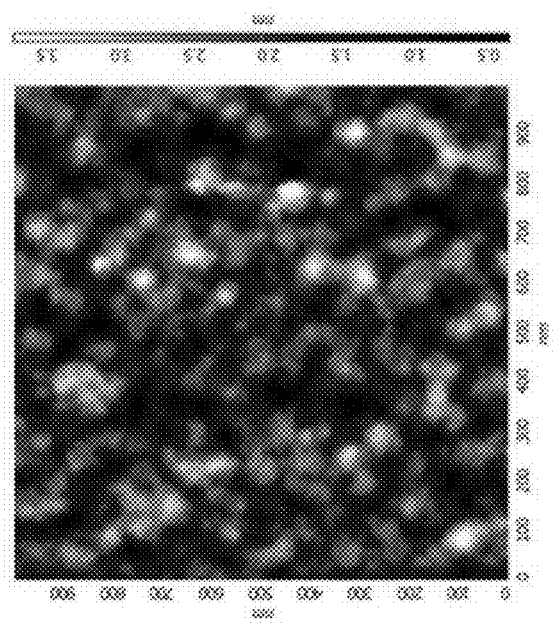
FIG. 5C shows an AFM image of a topography of a nitride film after being poled.
Figure 5D:
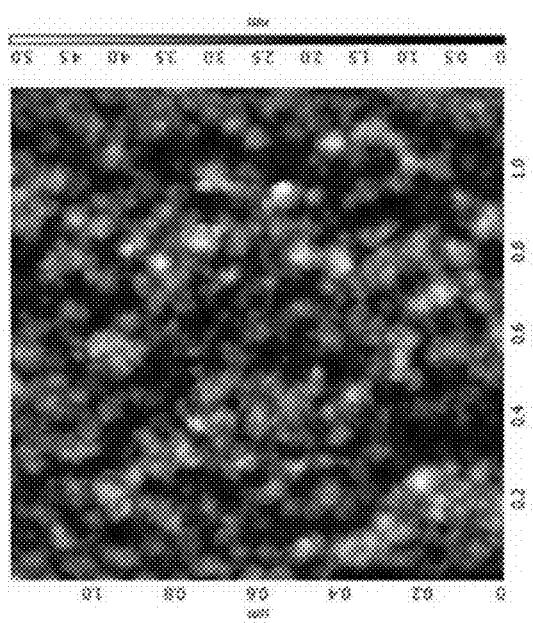
FIG. 5D shows an AFM image of a topography of an EFM phase image of poled nitride film.

FIG. 5A to FIG. 5D shows preliminary results of AFM poling. FIG. 5A shows an AFM image of a Topography of an as-deposited nitride film. FIG. 5B shows an AFM image of an EFM phase image of as-deposited nitride film scanned at low voltage (5V) applied to the tip. FIG. 5C shows an AFM image of a topography of a nitride film after being poled where the poling test was done by applying 30V dc to the tip. FIG. 5D shows an AFM image of a topography of an EFM phase image of poled nitride film. The scan in FIG. 5D was done over a slightly larger area than in FIG. 5C to show difference in EFM signal compared to un-poled background.

Preliminary testing has shown that after applying a bias across a silicon nitride sample, poling of the film can be observed when doing the "read" procedure using the AFM. To perform the preliminary experiment of AFM poling on a silicon nitride film, silicon nitride was deposited on a silicon wafer via low-pressure chemical vapor deposition (LPCVD). The sample was scanned with a conductive AFM tip electrostatic force microscopy (EFM) mode. In this mode a dc bias can be applied across the AFM cantilever tip. A "read" scan was performed with a low dc bias voltage of 5V and "write" scan performed with a dc bias voltage of 30V. The initial scans were done in the "read" voltage (FIG. 5A, FIG. 5B). Then, a small area of the sample 0.5×0.5 $\mu m^2$ was scanned in the "write" voltage to pole the film. Finally, the poled area with the "read" voltage was scanned to observe the poling (FIG. 5C, FIG. 5D). The EFM phase image showed that the poling was successful in showing that we can pole silicon nitride to induce a strong electro-optic effect as predicted by Khurgin, et al. [11] For the experiment, a Solver Next SPM instrument equipped with FMG01/Pt conductive cantilever tips and an external voltage amplifier were used. AFM poling shows that poling in silicon nitride is possible and can be used to optimize electric field parameters for the full sample poling process.

Part 4—In-Situ Electrical Poling of Silicon Nitride Films During Deposition

Poling of silicon nitride films "in-situ" can be done during the deposition to enable multilayer electrically active photonic devices, which can be integrated directly on electronics. In-situ electrical poling of silicon nitride films will open the door to 3D photonics and enable complex devices such as high radix switches, signal processing, two dimensional optical phase arrays with lambda over 2 spacing.

Figure 6:
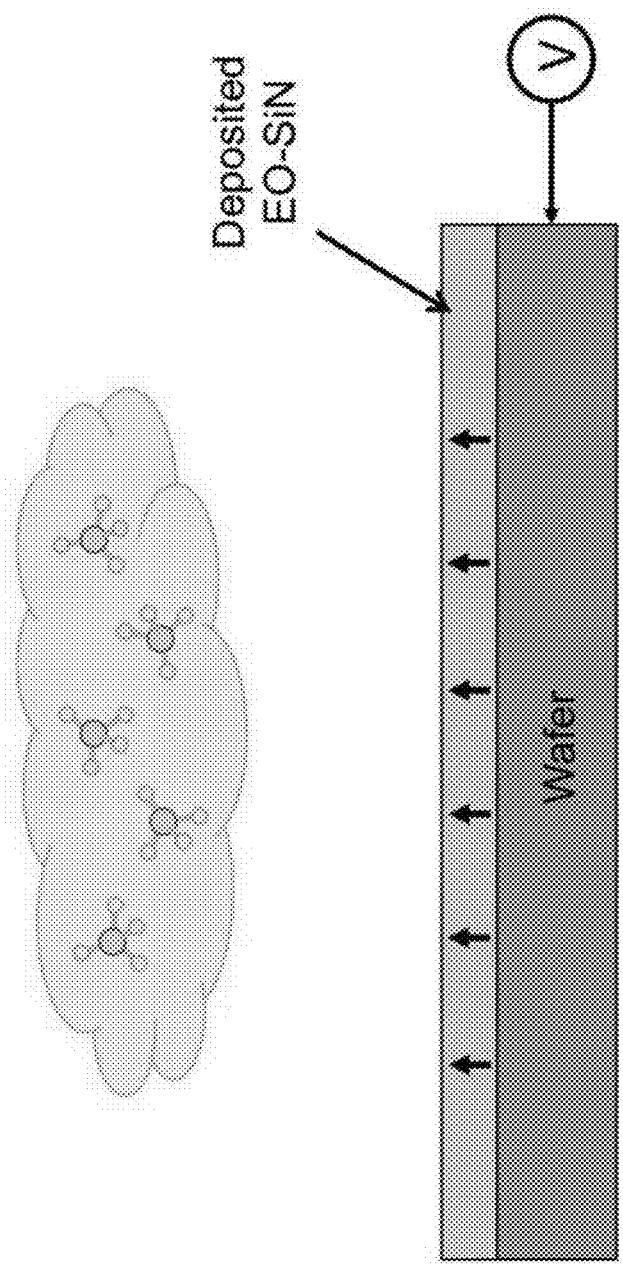
FIG. 6 shows a schematic diagram of an EO-SiN deposition process.

FIG. 6 shows a schematic diagram of an EO-SiN deposition process. The silicon nitride reacts in the plasma and is deposited on the surface of the wafer. The applied electric field across the substrate induces alignment of the dipoles and induces the electro-optic effect.

To pole the silicon nitride films during deposition, an electric field can be applied to the substrate while the film is being deposited (FIG. 6). An ideal time to arrange the dipoles of the silicon nitride film is during deposition, because the deposited constituents are highly mobile and can arrange themselves before "setting" on the film's surface. The deposition process also occurs at an elevated temperature making it easier for the dipoles align.

An inductively coupled plasma enhanced chemical vapor deposition (ICPCVD) can be used with a substrate bias. In ICPCVD nitride deposition, the sample sits at a temperature around 400° C. and silane and ammonia gases are used as precursors for the silicon and nitrogen content. These gases are broken up in the plasma and react to form the silicon nitride film on the substrate. The substrate can be electrically biased, forcing the dipoles in the film to align creating the electro-optic effect. A similar outcome has been observed with amorphous deposition of aluminum nitride via RF sputtering and a biased substrate [20,21]. In an ICPCVD, the plasma generation is decoupled from the substrate bias. The plasma is generated by an inductor coil. This technique allows us to control the plasma and substrate bias conditions independently.

Part 5—EO-SiN Microring Modulator

Figure 7:
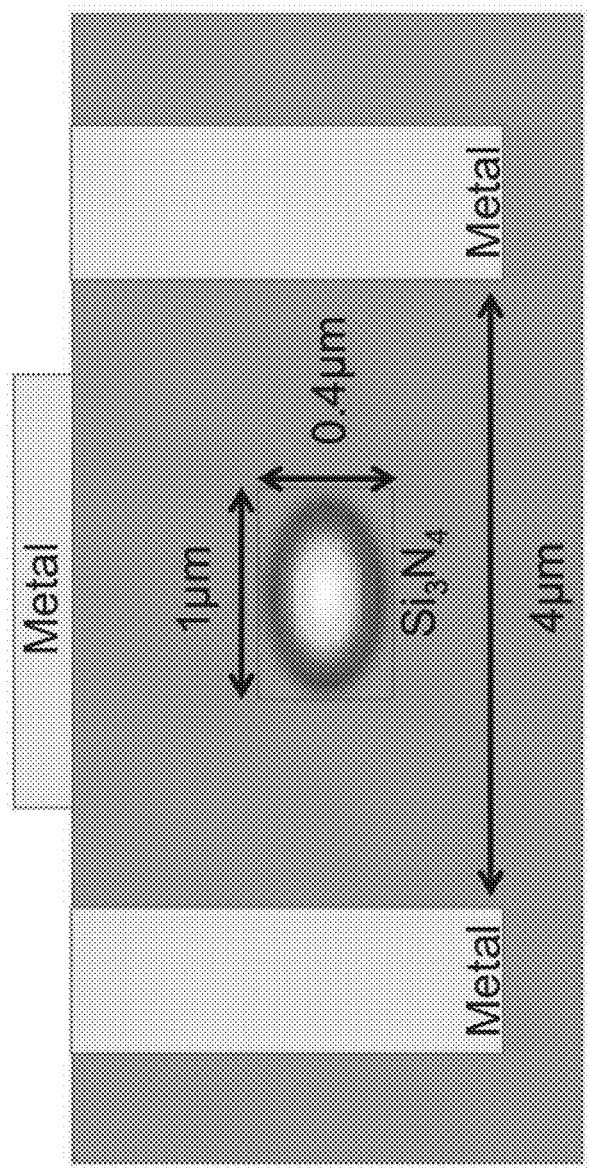
FIG. 7 is a cross section drawing of an exemplary microring modulator device fabricated in an EO-SiN platform.

FIG. 7 is a cross section drawing of an exemplary microring modulator device fabricated in an EO-SiN platform.

Figure 8:
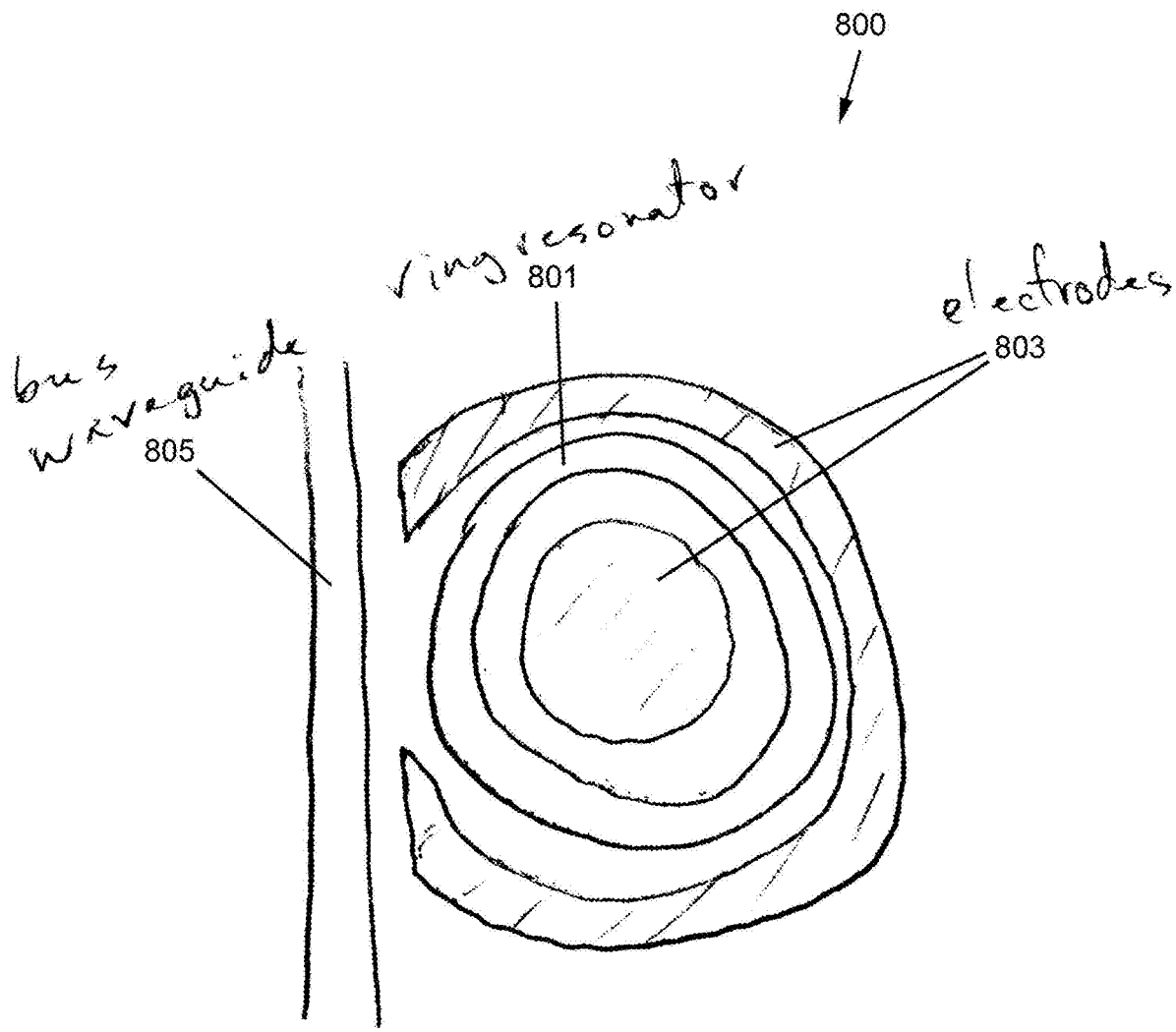
FIG. 8 is a drawing showing an exemplary ring modulator according to FIG. 7.

FIG. 8 is a drawing showing an exemplary ring modulator 800 integrated or planar optic structure according to FIG. 7. Ring resonator 801 is optically coupled to bus waveguide 805. The ring modulator 800 device can be modulated by applying a modulation voltage across electrodes 803.

A microring modulator fabricated in EO-SiN can be used to demonstrate the feasibility of fabricating active photonic devices in the described EO-SiN platform. The ring modulator has emerged as an exciting device for a chipscale modulator due to its compact size and ultra-low power consumption. The power consumption of a microring modulator goes as $\frac{1}{4}CV^2$, where C is the capacitance of the modulator and V is the driving voltage [22,23]. In silicon microring modulators, the power consumption can be very low down to the fJ/bit. However, the resonance wavelength of a silicon modulator needs to be stabilized due to fabrication imperfections and temperature fluctuations. The stabilization consumes at least 100 fJ/bit assuming conservative estimates of temperature fluctuation.

The EO-SiN modulator consumes very little power. A suitable modulator design includes a waveguide with a cross-section of about 1.5 μm wide by 0.4 μm thick (FIG. 7). The optical loss due to the proximity of the metal electrodes is estimated to be about 0.03 dB/cm. Increasing electrode separation to 5 μm can reduce loss to about 0.001 dB/cm. Optical loss and electrode proximity are a trade-off between electrical performance and insertion loss and can be optimized to minimize overall power consumption. For a ring radius of 20 μm and an electrode separation of 4 μm the capacitance is about 3 fF. For a driving voltage of 1V, the power consumption of the modulator is less than 1 fJ/bit (=0.75 fJ/bit). However, because there is no current needed to bias the modulator, the resonance stabilization consumes substantially no power. The EO-SiN modulator has very low optical loss and hence also consumes very low optical power, which leads to a record high device efficiency.

A 10 GHz modulation can be used with an EO-SiN microring modulator. The 10 GHz modulation speed can demonstrate the capability of the proposed electro-optic, deposited, CMOS compatible platform. Assuming parallel plate capacitor with about 3 µm thick electrodes the electric field across the waveguide should be about 1.75 MV/m for a 4 µm electrode separation. The RC constant for this configuration is 1.3 fs per micron. For a 10 mm length device the response time can be 13 ps, <70 GHz. The ring modulator has a length of only about 126 µm, which yields a response time of only 164 fs for an RC limit of over a Terahertz.

The described EO-SiN platform can enable substantially lossless, ps time scale phase modulation. The change in refractive index for an electro-optic material is given by $\Delta n=\frac{1}{2}n^3 rE$, where is n is the refractive index of silicon nitride (2.0,) r is the electro-optic coefficient (~100-300 pm/V predicted) and E is the applied electric field. For an electric field of 1.75 MV/m in the waveguide core and using an electro-optic coefficient of 100 pm/V, a conservative estimate based on theory[11], a change in refractive index of $7 \times 10^{-4}$ is expected. For comparison, the length required to change the phase by half a wave in state of the art lithium niobate modulators for an applied voltage of 1V is over 10 centimeters [24]. In silicon, using a reverse biased pn junction, the same phase shift can be achieved in a length of 0.1 centimeters but with an optical loss of 1 dB and an RC limited bandwidth around 8 GHz [3]. However, the proposed EO-SiN will reduce this length down to 0.3 to 0.8 centimeters (depending on the electro-optic coefficient) with an RC limited bandwidth of 100 GHz.

Part 6—Applications

EO-SiN will enable unprecedented adaptability and agility in using the electromagnetic spectrum with low cost, low power devices capable of operating from the visible to the mid infrared parts of the spectrum (~500 nm-4000 nm). Complex devices can be engineered based on the proposed platform enabling multifunctional capabilities such as communications, sensing, and jamming in ultra-compact packages.

The described EO-SiN can revolutionize photonic devices and their monolithic integration with electronics. Monolithic integration maximizes performance by avoiding spurious inductance and capacitance from electrical wire bonding and/or chip-to-chip bonding. Monolithic integration also minimizes cost by enabling complex device fabrication at the wafer level without the need for "piecing" together individual chips. Also, new methods and devices according to the Application can enable multilayer active photonics. Photonic devices can be built according to the methods and devices of the Application with multiple device layers in the vertical direction. Also, stacking photonics in the vertical dimension can transform photonics in a similar way to how many level mentalizations has transformed electronics.

EO-SiN can revolutionize on-chip quantum optics and nonlinear optics. An active photonic platform compatible with integration with electronics can usher a new level of complexity quantum optic photonic circuits where lossless, ps scale switching is possible. Similarly, in the field of nonlinear optics, this novel platform of the Application can transform Kerr frequency combs by enabling native f-2f stabilization on-chip. New devices can also be made that combine $\chi^{(2)}$ and $\chi^{(3)}$ (third order susceptibility) processes on a single chip with the phase matching and dispersion engineering capabilities of high refractive index contrast waveguide structures.

Part 7-3D Photonics Structures

Figure 9:
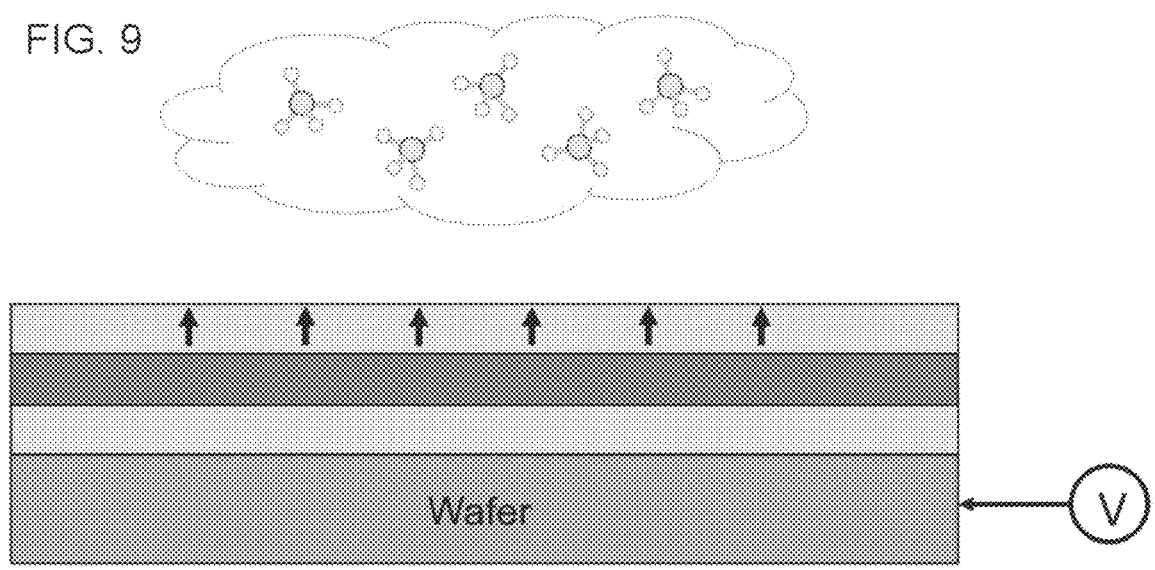
FIG. 9 is a drawing of an electro-optic silicon nitride 3D device structure where at least one additional silicon nitride layer has been deposited on a substrate or base layer to form at least one more stacked poled layer of a 3D photonics structure.

FIG. 9 is a drawing of an electro-optic silicon nitride 3D device structure where at least one additional silicon nitride layer has been deposited on a substrate or base layer to form at least one more stacked poled layer of a 3D photonics structure.

Figure 10:
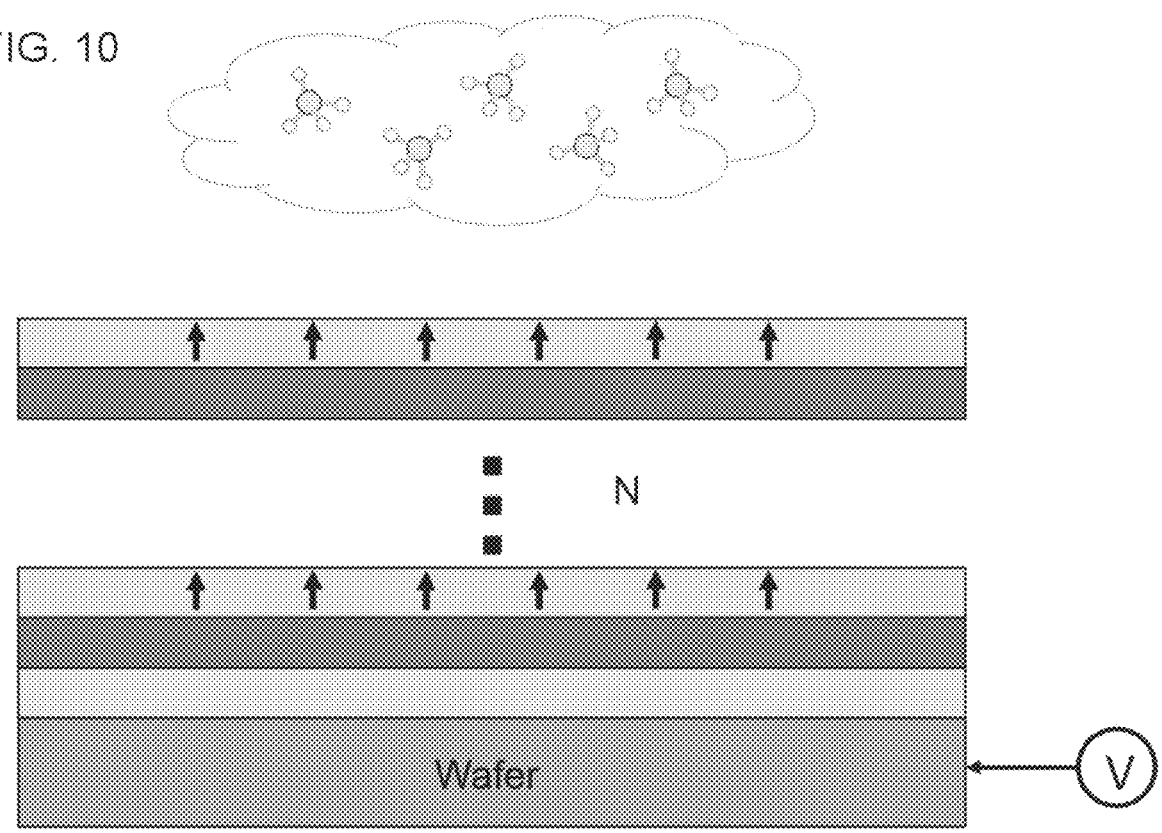
FIG. 10 is a drawing of an electro-optic silicon nitride 3D device structure having N stacked poled layers of a 3D photonics structure.

FIG. 10 is a drawing of an electro-optic silicon nitride 3D device structure having N stacked poled layers of a 3D photonics structure.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

Part 8—Integrated Microheater

Poling of silicon nitride optical structure can also be performed by an electric field impressed across a locally heated area on a sample, such as by building an integrated microheater and using the sample's electrodes for the poling. The microheater can be a resistive heater, such as a heater electrode deposited on a substrate or base layer. One of the same two electrodes used to create the poling electric field across a gap, can also be used for ohmic heating by passing a heating current through an electrode. A voltage applied across the resistive heater causes the heating current to flow through the heating electrode which causes an ohmic heating of the local area of the substrate or base layer. Thus, the poling process by application of electric field can be performed on a locally heated substrate or base layer.

Figure 11:
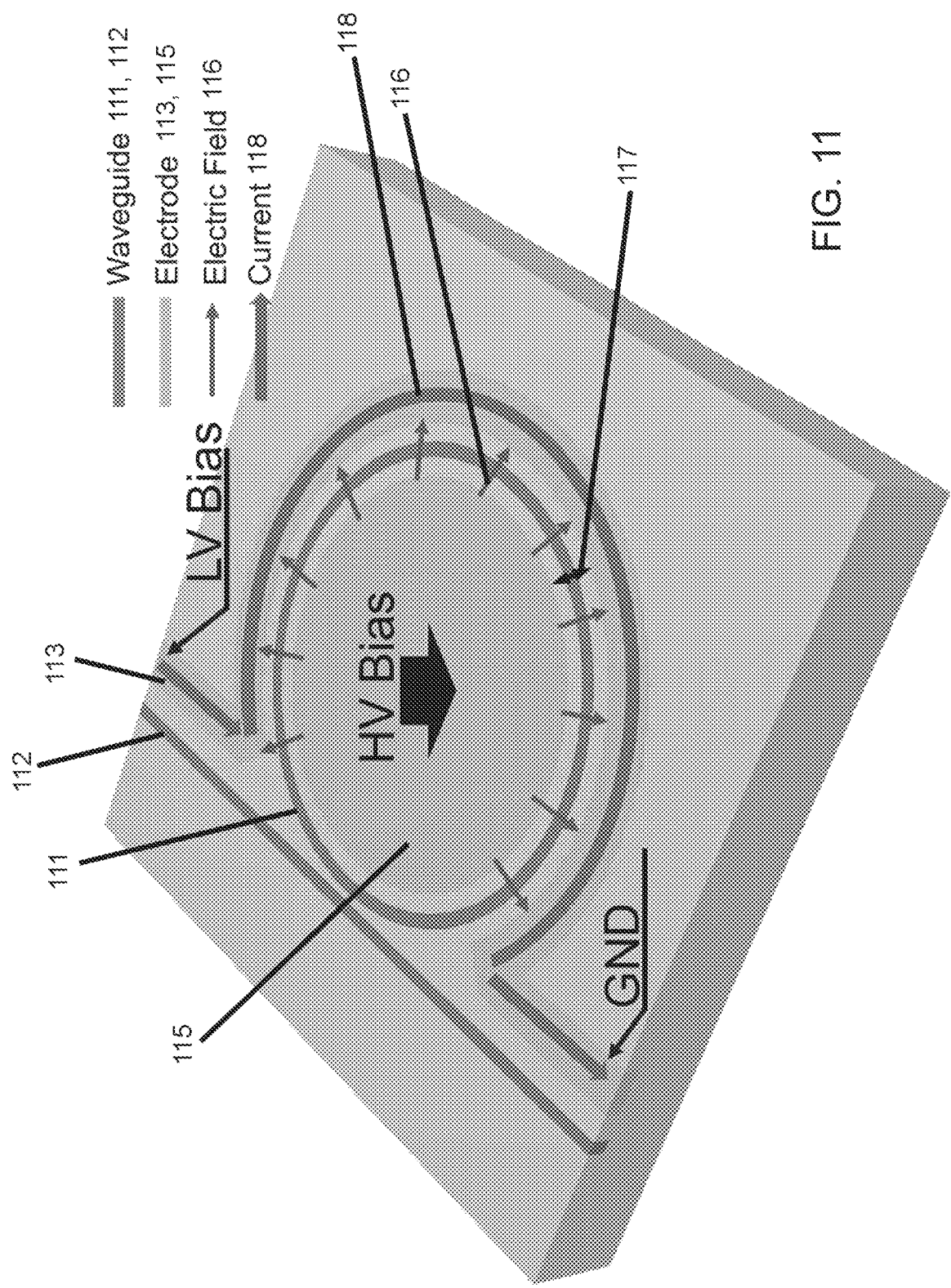
FIG. 11 is a drawing showing an exemplary integrated ring modulator structure poled by an electric field impressed across a silicon nitride structure heated by an integrated microheater.

FIG. 11 is a drawing showing an exemplary integrated ring modulator structure poled by an electric field impressed across a silicon nitride structure heated by an integrated microheater. The exemplary structure and method of FIG. 11 is similar to that of FIG. 8. What is different is that now the outer electrode, annulus electrode 113, in addition to providing one of two electrodes for the high voltage bias (HV Bias) for poling, now also can carry a heating current through the annulus electrode 113 to provide heating in the local area so that the poling process method can now be performed on a locally heated structure, through ohmic heating of the annulus electrode 113 itself.

In the exemplary structure of FIG. 11, an integrated planar optical ring waveguide 111 is optically coupled to bus waveguide 112. A circular electrode 115 and annulus electrode 113 (e.g. a platinum annulus electrode) are deposited around the ring waveguide to heat and pole the local structure including the ring waveguide 111 during the poling process. The circular electrode 115 is placed inside the ring waveguide 111 concentrically. The radius of circular electrode 115 defines a gap 117 between the annulus electrode 113 and the ring of the circular electrode 115, a gap of about a few microns, typically about 0.1 to 10 microns. The annulus electrode 113 at least partially surrounds the outside of the ring waveguide 111 and the circular electrode 115 concentrically. The ring waveguide 111 is disposed in the gap 117 such that there is gap between the inside edge of the ring waveguide 111 and the circular electrode 115, as well as gap between outside edge of the ring waveguide 111 and the annulus electrode 113.

Generally, the example shows how poling can be performed between any suitable electrodes separated with a gap between the electrodes, so that an electric field can be established between the electrodes by a high voltage bias. Additionally, a heating current can be caused to flow through one of the electrodes for ohmic heating to heat the local structure being poled by electric field.

The two ends of the annulus ring can extend to square pad electrodes (not shown in FIG. 11) for contact with micro probes.

When operating this setup, a set of conductive micro probes can be descended from the top (from over the device side of the substrate) to get in firm contact with the circular electrode and the pad electrodes connected with the annulus one. Then voltage is applied to these electrodes through the probes. When we only need to do poling, a high voltage, typically 100V, is applied on the circular electrode and both ends of the annulus electrode are grounded, so that a strong statistic electric field is built across the ring waveguide.

To do heating at the same time, the voltage applied on one end of the annulus electrode is changed from ground to a low voltage (typically 10V). Because this voltage is relatively low, the additional heating voltage only slightly decreases the intensity of the poling field. However, the heating voltage can generate a powerful (if the resistance of the electrode is controlled properly) heating electrode through the annulus waveguide. The current works as a heat source and heats up the ring by resistive heating.

Example: Typically, with a current of 80 mA and a gap of 1.5 μm between the annulus electrode and the ring, the heating current caused by the heating voltage, in simulations, we were able to heat up the ring to around 200 C. Or 150 mA to 400 C.

While an exemplary ring resonator is shown in FIG. 8 and FIG. 11, the new method of local poling in the presence of an integrated microheater (heating electrode) can be used for any suitable integrated structure including devices other than ring resonators or ring modulators where the device structure includes any suitable structural geometry which allows for poling by HV bias applied across electrodes, or poling by HV bias applied across electrodes combined with ohmic heating by passing a heating current through at least one of the electrodes or another locally disposed integrated microheater. For example, there can be integrated electro-optical devices which include straight sections of silicon nitride waveguide to be poled during production.

The electrodes can be disposed on either side of a silicon nitride optical element, typically a silicon nitride waveguide, as shown in FIG. 11. Alternatively, such as, for example, where there are typically multiple layers, the electrodes can be on different layers, such as, above and below a silicon nitride feature to be poled. Similarly, either one or both of the electrodes, regardless of positioning and geometry, can be used for ohmic heating as one or more integrated microheaters as described hereinabove. For example, a first electrode can be deposited on the substrate or the base layer on a first side of or above at least one silicon nitride optical waveguide, the first electrode to accept a first polarity of a high voltage bias for poling. A second electrode can be deposited on a second side of or below the at least one silicon nitride optical waveguide, the electrode to accept the other second polarity of the high voltage bias to impress an electric field across the silicon nitride optical waveguide for poling.

The electrodes used to establish the electric field and/or to establish the electric field where one or more of the electrodes is also used for local ohmic heating, can be the same as the device electrodes (internal terminals on the integrated chip or integrated circuit (IC)) which are used to later operated the electro-optic device post-production in normal operation of the integrated electro-optic circuit, typically an integrated component (e.g. IC) of a larger circuit board, apparatus, or system. For example, in FIG. 8, and FIG. 11, the same electrodes used for poling or poling an electrode heated local area, can be the same as the internal operating terminals of the exemplary electro-optical silicon nitride modulator.

While local heating by ohmic heating of at least one electrode was described in with respect to FIG. 11, there can be other forms of local heating during polling, such as, for example, local heating by any suitable laser light. Alternatively, there can be fabrication with larger area heating by heated plate, such as, for example, a hot plate.

REFERENCES

1. Winning The Airwaves: Regaining America's Dominance In The Electromagnetic Spectrum. CSBA Available at: http://csbaonline.org/research/publications/winning-the-airwaves-sustaining-americas-advantage-in-the-electronic-spectr.
2. Soref, R. A. & Bennett, B. R. Electrooptical effects in silicon. *IEEE J. Quantum Electron.* 23, 123-129 (1987).
3. Spector, S. J. et al. Operation and Optimization of Silicon-Diode-Based Optical Modulators. *IEEE J. Sel. Top. Quantum Electron.* 16, 165-172 (2010).
4. Hu, H., Ricken, R., Sohler, W. & Wehrspohn, R. B. Lithium Niobate Ridge Waveguides Fabricated by Wet Etching. *IEEE Photonics Technol. Lett.* 19, 417-419 (2007).
5. Cardenas, J. et al. Optical nonlinearities in high-confinement silicon carbide waveguides. *Opt. Lett.* 40, 4138 (2015).
6. Levy, J. S., Foster, M. A., Gaeta, A. L. & Lipson, M. Harmonic generation in silicon nitride ring resonators. *Opt. Express* 19, 11415-11421 (2011).
7. Ning, T. et al. Strong second-harmonic generation in silicon nitride films. *Appl. Phys. Lett.* 100, 161902 (2012).
8. Kitao, A., Imakita, K., Kawamura, I. & Fujii, M. An investigation into second harmonic generation by Si-rich SiN x thin films deposited by RF sputtering over a wide range of Si concentrations. *J. Phys. Appl. Phys.* 47, 215101 (2014).
9. Pecora, E. F., Capretti, A., Miano, G. & Negro, L. D. Generation of second harmonic radiation from sub-stoichiometric silicon nitride thin films. *Appl. Phys. Lett.* 102, 141114 (2013).
10. Puckett, M. W. et al. Observation of second-harmonic generation in silicon nitride waveguides through bulk nonlinearities. *Opt. Express* 24, 16923 (2016).
11. Khurgin, J. B., Stievater, T. H., Pruessner, M. W. & Rabinovich, W. S. On the origin of the second-order nonlinearity in strained Si—SiN structures. *J. Opt. Soc. Am. B* 32, 2494 (2015).
12. Second-order Nonlinear Optical Characterization Techniques: An Introduction. CRC Press (2017). Available at: https://www.crcpress.com/Second-order-Nonlinear-Optical-Characterization-Techniques-An-Introduction/Verbiest-Clays-Rodriguez/p/book/9781138118263.
13. Pavlides, P. & Pugh, D. General theory of Maker fringes in crystals of low symmetry. *J. Phys. Condens. Matter* 3, 967 (1991).
14. Heisler, I. A., Misoguti, L., Zílio, S. C., Rodriguez, E. V. & Bartolomeu de Araújo, C. Spectrally resolved femtosecond Maker fringes technique. *Appl. Phys. Lett.* 92, 091109 (2008).

15. Park, D. H. & Herman, W. N. Closed-form Maker fringe formulas for poled polymer thin films in multilayer structures. *Opt. Express* 20, 173-185 (2012).
16. Garcia, F. C., Carvalho, I. C. S., Hering, E., Margulis, W. & Lesche, B. Inducing a large second-order optical nonlinearity in soft glasses by poling. *Appl. Phys. Lett.* 72, 3252-3254 (1998).
17. Brueck, S. R. J. & Myers, R. A. Applications of Nonlinear Optical Thin Films *MRS Online Proc. Libr. Arch.* 341, (1994).
18. Parsons, G. N., Souk, J. H. & Batey, J. Low hydrogen content stoichiometric silicon nitride films deposited by plasma☐enhanced chemical vapor deposition. *J. Appl. Phys.* 70, 1553-1560 (1991).
19. Seidel, J. et al. Prominent electrochromism through vacancy-order melting in a complex oxide. *Nat. Commun.* 3, ncomms1799 (2012).
20. Xiong, C., Pernice, W. H. P. & Tang, H. X. Low-Loss, Silicon Integrated, Aluminum Nitride Photonic Circuits and Their Use for Electro-Optic Signal Processing. *Nano Lett.* 12, 3562-3568 (2012).
21. Jung, H., Xiong, C., Fong, K. Y., Zhang, X. & Tang, H. X. Optical frequency comb generation from aluminum nitride microring resonator. *Opt. Lett.* 38, 2810-2813 (2013).
22. Dong, P. et al. Low Vpp, ultralow-energy, compact, high-speed silicon electro-optic modulator. *Opt. Express* 17, 22484-22490 (2009).
23. Dong, P. et al. High-speed and compact silicon modulator based on a racetrack resonator with a 1 V drive voltage. *Opt. Lett.* 35, 3246 (2010).
24. Cox, C. et al. Design of a broadband electro-optic modulator with very low Vπ. *Tech. Pap. Photonic Syst. U. S.* (2003).
25. Cardenas, J. et al. Low loss etchless silicon photonic waveguides. *Opt. Express* 17, 4752-4757 (2009).
26. Cardenas, J. et al. High Q SiC microresonators. *Opt. Express* 21, 16882-16887 (2013).
27. Cardenas, J. et al. High Coupling Efficiency Etched Facet Tapers in Silicon Waveguides. *IEEE Photonics Technol. Lett.* 26, 2380-2382 (2014).
28. Cardenas, J. et al. Linearized silicon modulator based on a ring assisted Mach Zehnder inteferometer. *Opt. Express* 21, 22549 (2013).
29. Griffith, A. G. et al. Silicon-chip mid-infrared frequency comb generation. *Nat Commun* 6, (2015).
30. Phare, C. T., Daniel Lee, Y.-H., Cardenas, J. & Lipson, M. Graphene electro-optic modulator with 30 GHz bandwidth. *Nat. Photonics* 9, 511-514 (2015).
31. Gabrielli, L. H., Cardenas, J., Poitras, C. B. & Lipson, M. Silicon nanostructure cloak operating at optical frequencies. *Nat. Photonics* 3, 461-463 (2009).

What is claimed is:

1. An integrated device or a photonic device including electro-optical structure to be poled during device fabrication comprising:
   a substrate or a base layer;
   at least one optical waveguide or photonic device comprising at least one electro-optic (EO) optical waveguide or at least one EO photonic device formed from a silicon nitride deposited on said substrate or said base layer;
   a first electrode deposited on said substrate or said base layer on a first side of or above said at least one optical waveguide or photonic device, said first electrode to accept a first polarity of a high voltage bias;
   a second electrode deposited on a second side of or below said at least one optical waveguide or photonic device, said second electrode to accept a second polarity of said high voltage bias; and
   wherein said at least one optical waveguide or photonic device is poled by application of said high voltage bias during production.

2. The integrated device of claim 1, wherein at least one of said first electrode and said second electrode comprises an ohmic heating element adapted to accept a heating current applied therethrough.

3. The integrated device of claim 1, wherein said first electrode and said second electrode comprise internal operating terminals of said integrated device.

4. The integrated device of claim 3, wherein said optical waveguide or photonic device comprises a ring resonator, said first electrode is disposed within said ring resonator, and said second electrode disposed outside of said ring resonator, and said first electrode comprises a circular shape, and said second electrode comprises an annulus shape.

5. The integrated device of claim 1, wherein said integrated device comprises an integrated silicon nitride optical waveguide or photonic device as part of a CMOS integrated circuit.

6. An electro-optic (EO) silicon nitride device comprising:
   a substrate or a base layer;
   at least one electro-optic (EO) silicon nitride optical waveguide or at least one EO silicon nitride photonic device comprising a silicon nitride deposited on said substrate or said base layer;
   wherein said at least one optical waveguide or said at least one EO photonic device is poled to transform said silicon nitride deposited on said substrate, into an EO silicon nitride.

* * * * *